(12) United States Patent
Kwon et al.

(10) Patent No.: US 12,713,863 B2
(45) Date of Patent: Aug. 18, 2026

(54) SUBSTRATE TREATMENT APPARATUS AND METHOD

(71) Applicant: SEMES CO., LTD., Chungcheongnam-do (KR)

(72) Inventors: Sang Young Kwon, Gyeonggi-do (KR); Ki Young Kwak, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/734,047

(22) Filed: Apr. 30, 2022

(65) Prior Publication Data

US 2022/0355345 A1 Nov. 10, 2022

(30) Foreign Application Priority Data

May 10, 2021 (KR) ........................ 10-2021-0059715

(51) Int. Cl.
*H10P 70/00* (2026.01)
*H10P 72/00* (2026.01)

(52) U.S. Cl.
CPC .......... *H10P 72/0414* (2026.01); *H10P 70/20* (2026.01)

(58) Field of Classification Search
None
See application file for complete search history.

(56) References Cited

U.S. PATENT DOCUMENTS

2002/0189643 A1* 12/2002 Chen .......................... B08B 3/04 257/E21.228
2007/0131256 A1* 6/2007 Nanba .................. G11B 23/505 134/33
2007/0295365 A1* 12/2007 Miya ................. H01L 21/67051 134/33
2008/0135070 A1* 6/2008 Lu ..................... H01L 21/67051 134/103.2
2017/0236703 A1* 8/2017 Higuchi .............. B05B 12/1418 134/18

(Continued)

FOREIGN PATENT DOCUMENTS

JP 4369325 11/2009
JP 2013-183140 9/2013

(Continued)

OTHER PUBLICATIONS

Translation of KR 20090033935 by Lee, published Apr. 7, 2009.*

(Continued)

*Primary Examiner* — Kaj K Olsen
*Assistant Examiner* — Ryan L Coleman
(74) *Attorney, Agent, or Firm* — WOMBLE BOND DICKINSON (US) LLP

(57) ABSTRACT

Provided are a substrate treatment apparatus and method for treating a substrate while preventing the surface of the substrate from drying out. The substrate treatment method includes: moving a first nozzle to above a first point on a substrate; ejecting a first substrate treatment liquid onto the substrate from the first nozzle; moving a second nozzle to above the first point; and ejecting a second substrate treatment liquid onto the substrate from the second nozzle, wherein the second nozzle is positioned above a second point on the substrate before moving to above the first point.

5 Claims, 13 Drawing Sheets

(56) References Cited

U.S. PATENT DOCUMENTS

| | | | | |
|---|---|---|---|---|
| 2017/0274415 | A1* | 9/2017 | Kim | B08B 3/024 |
| 2018/0005817 | A1* | 1/2018 | Kim | H10P 70/15 |
| 2019/0088511 | A1* | 3/2019 | Tanaka | H01L 21/306 |
| 2020/0381245 | A1* | 12/2020 | Takeguchi | B08B 3/10 |
| 2023/0099012 | A1* | 3/2023 | Sakurai | B08B 13/00 134/18 |

FOREIGN PATENT DOCUMENTS

| | | | |
|---|---|---|---|
| JP | 2015023182 | * | 2/2015 |
| JP | 2021-34738 | | 3/2021 |
| KR | 20060047764 | * | 5/2006 |
| KR | 10-2009-0033935 | | 4/2009 |
| KR | 10-2017-0017746 | | 2/2017 |
| KR | 10-1842118 | | 5/2018 |
| KR | 10-2018-0121731 | | 11/2018 |
| KR | 10-2020-0133020 | | 11/2020 |

OTHER PUBLICATIONS

Definition of “radius” from the Merriam-Webster dictionary.*
Translation of KR20060047764 by Ogawa, published May 18, 2006.*
The Merriam-Webster dictionary definition of “leak”.*
Computer-provided translation of JP2015023182 by Nonaka, dated Feb. 2, 2015.*
Human translation of paragraph [0043] of JP2015023182 by Nonaka, dated Feb. 2, 2015.*
Office Action dated Feb. 2, 2023 for Korean Patent Application No. 10-2021-0059715 and its English translation from Global Dossier.

* cited by examiner

[FIG. 1]
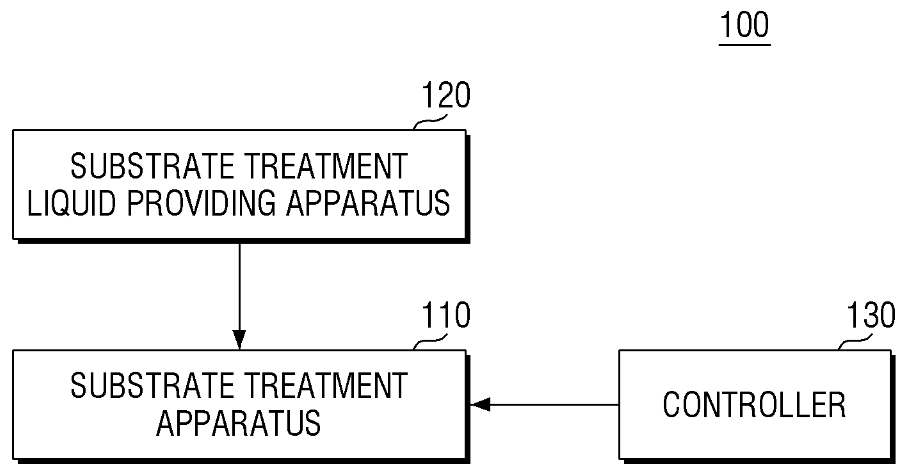

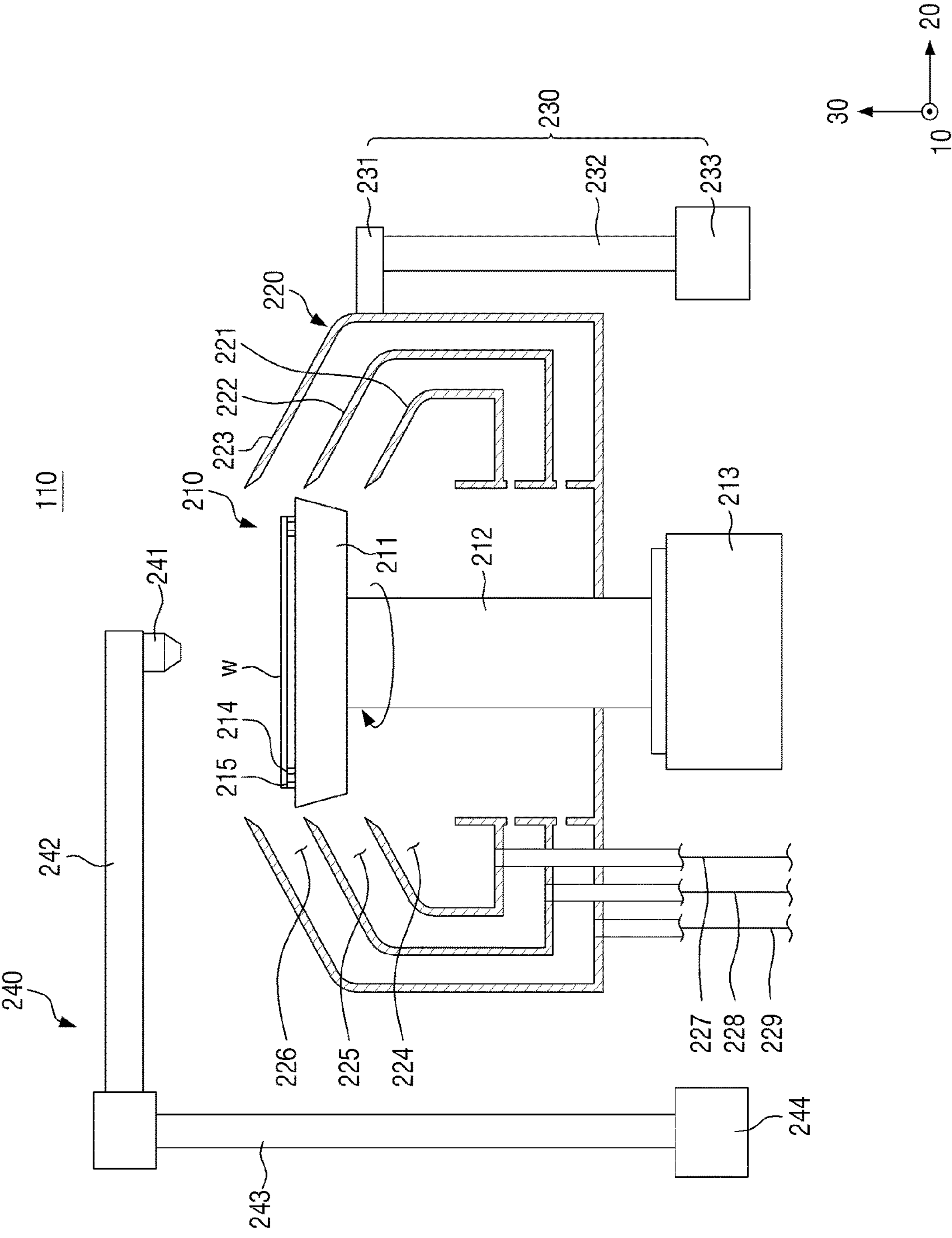
[FIG. 2]

[FIG. 3]
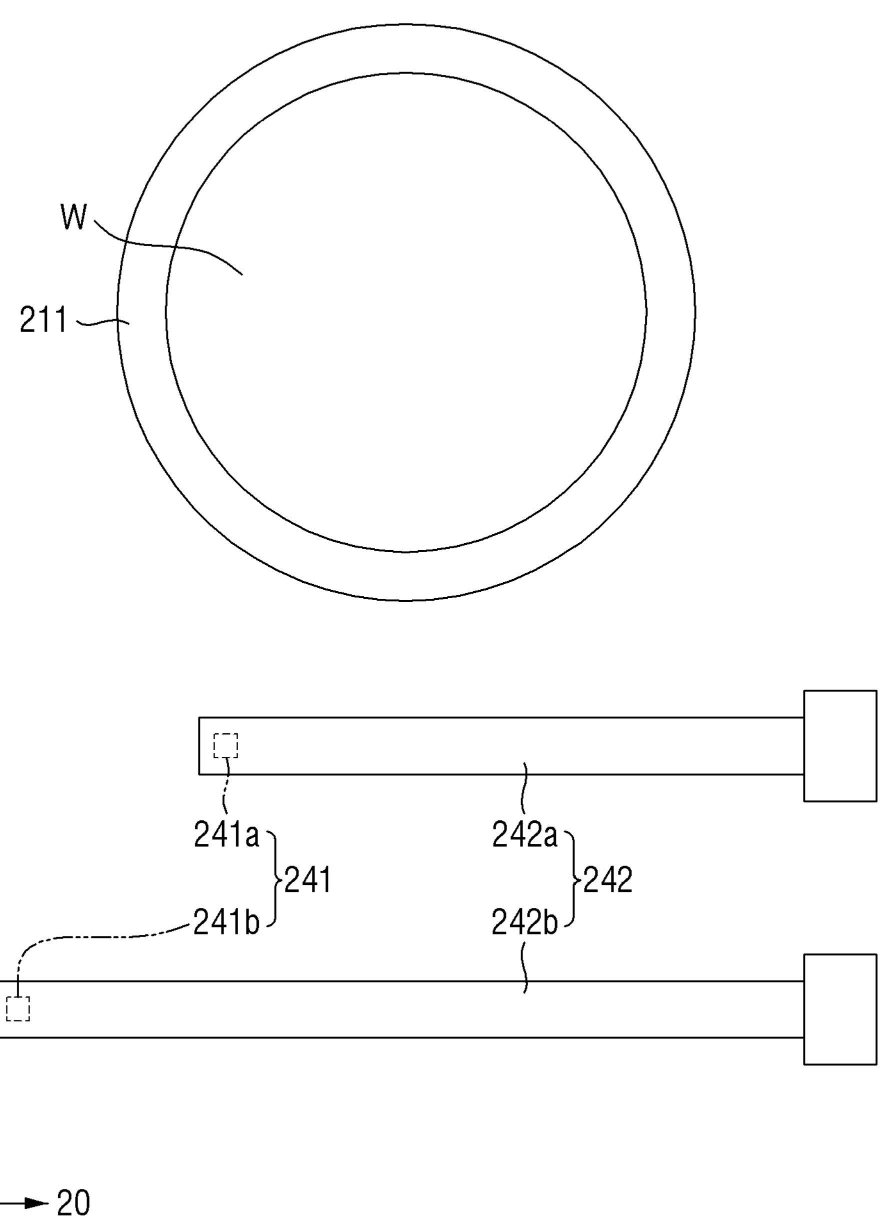

[FIG. 4]
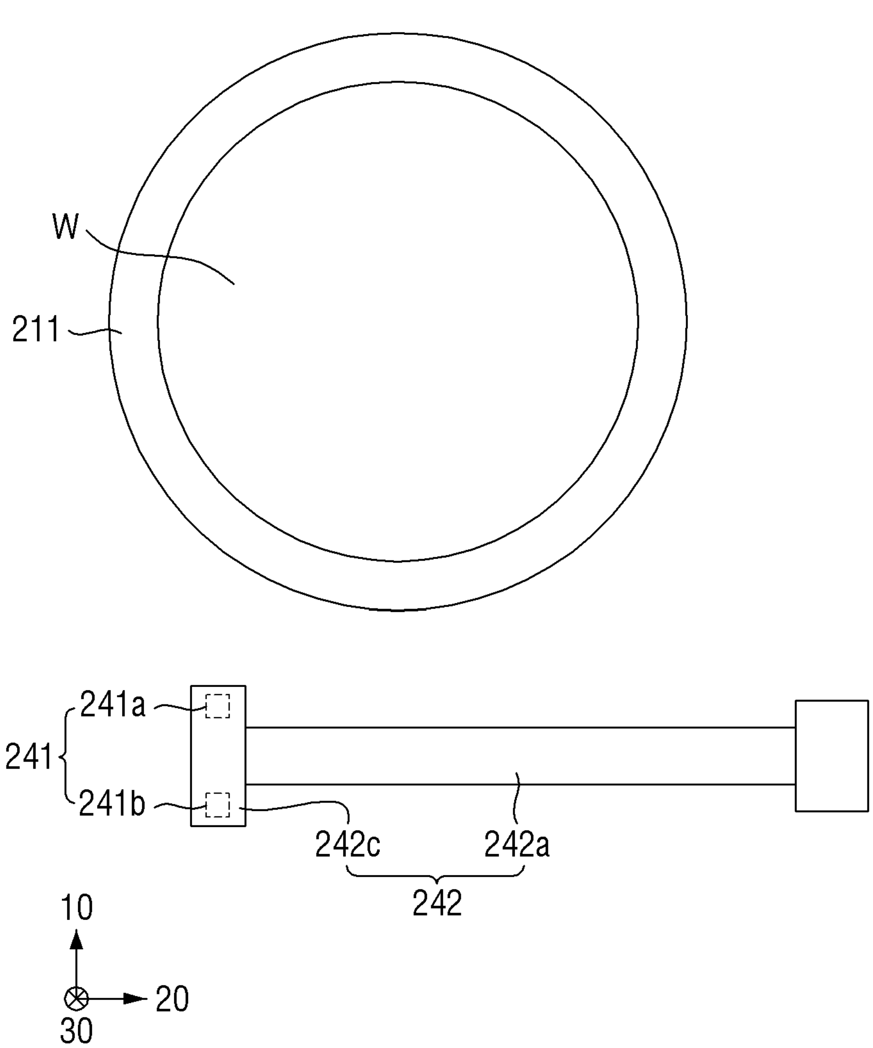

[FIG. 5]
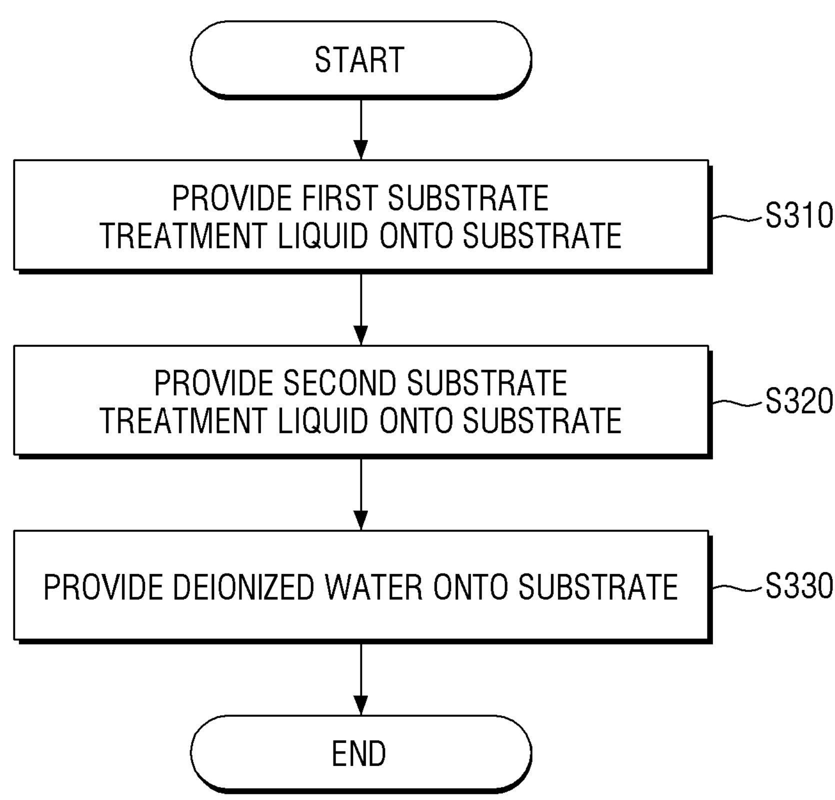

[FIG. 6]
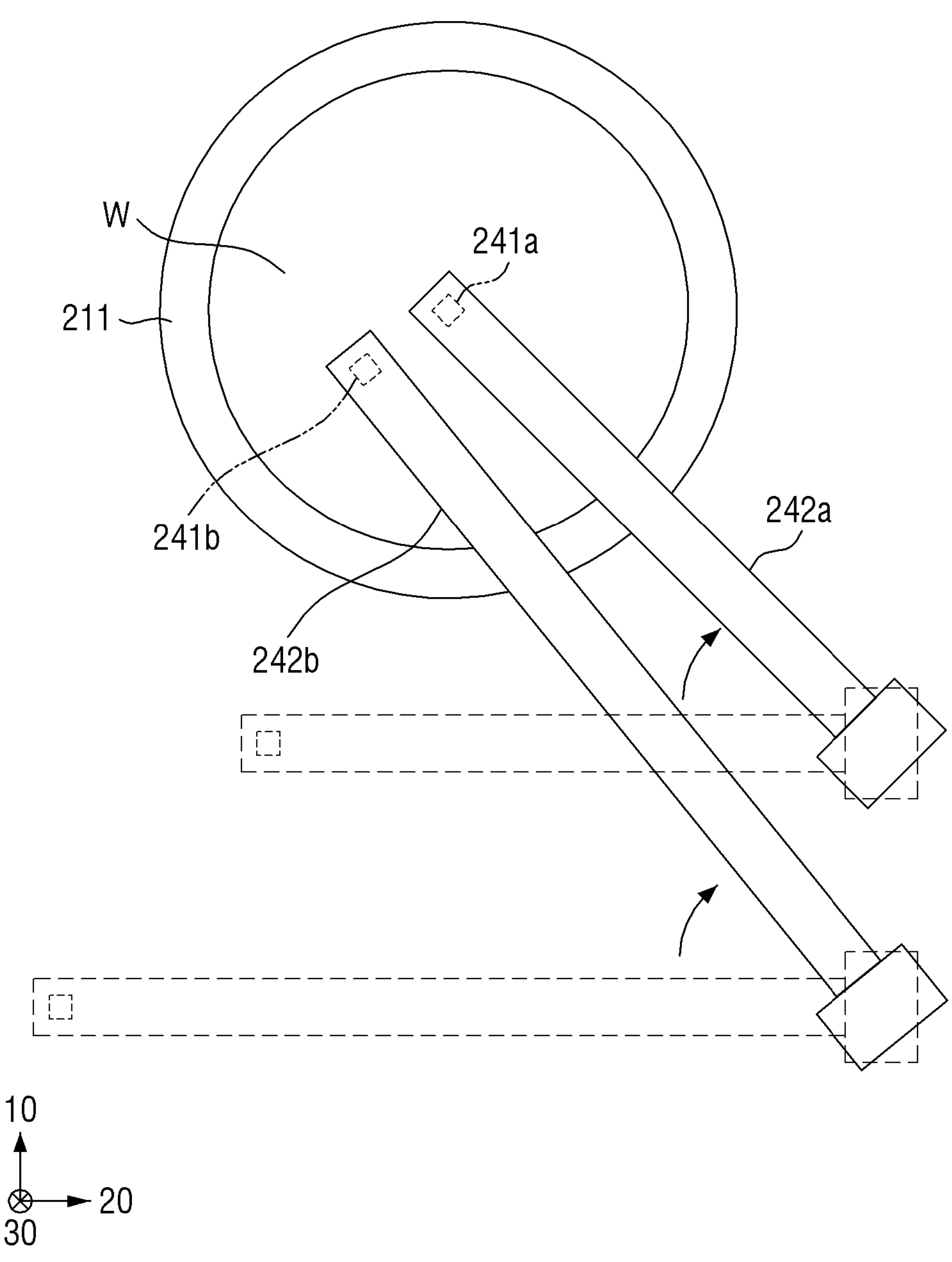

[FIG. 7]
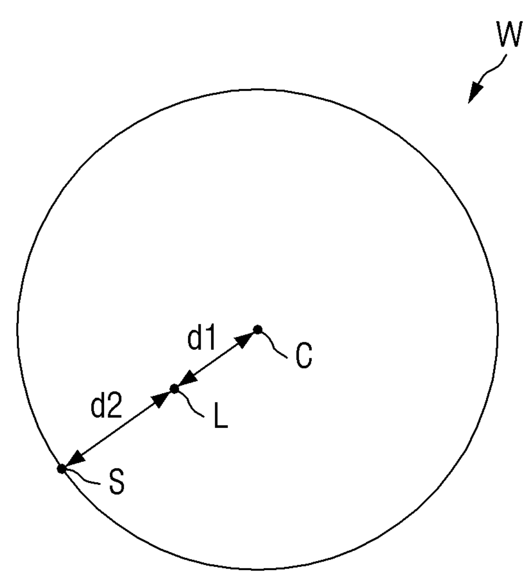

[FIG. 8]
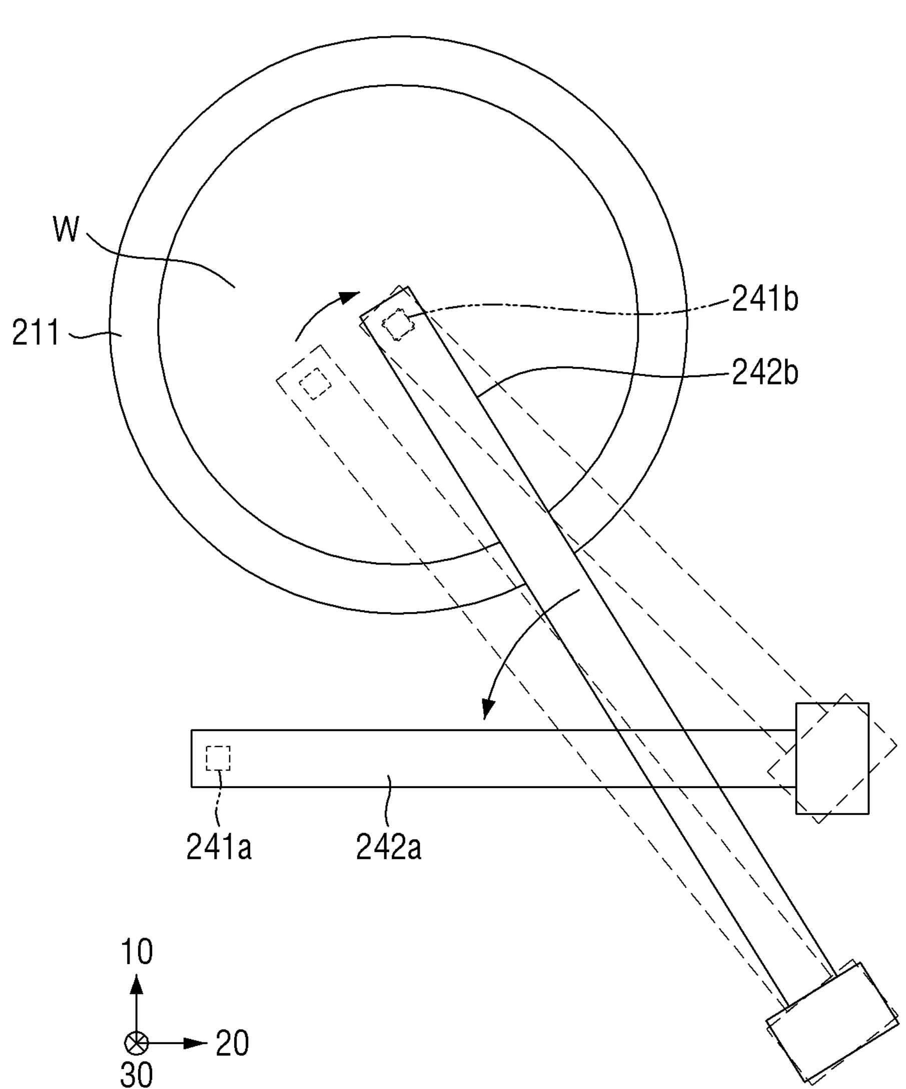

[FIG. 9]
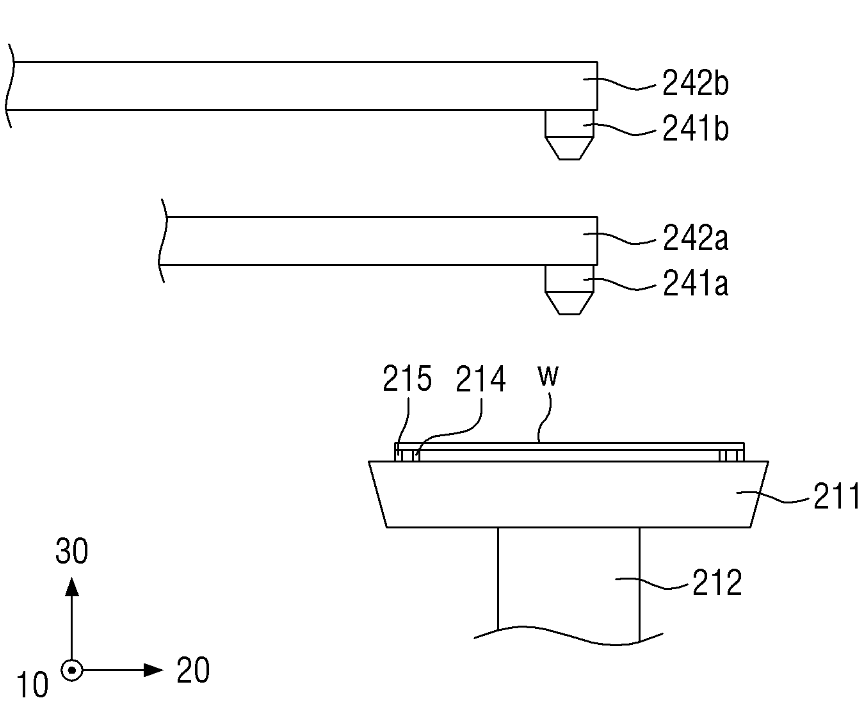

[FIG. 10]
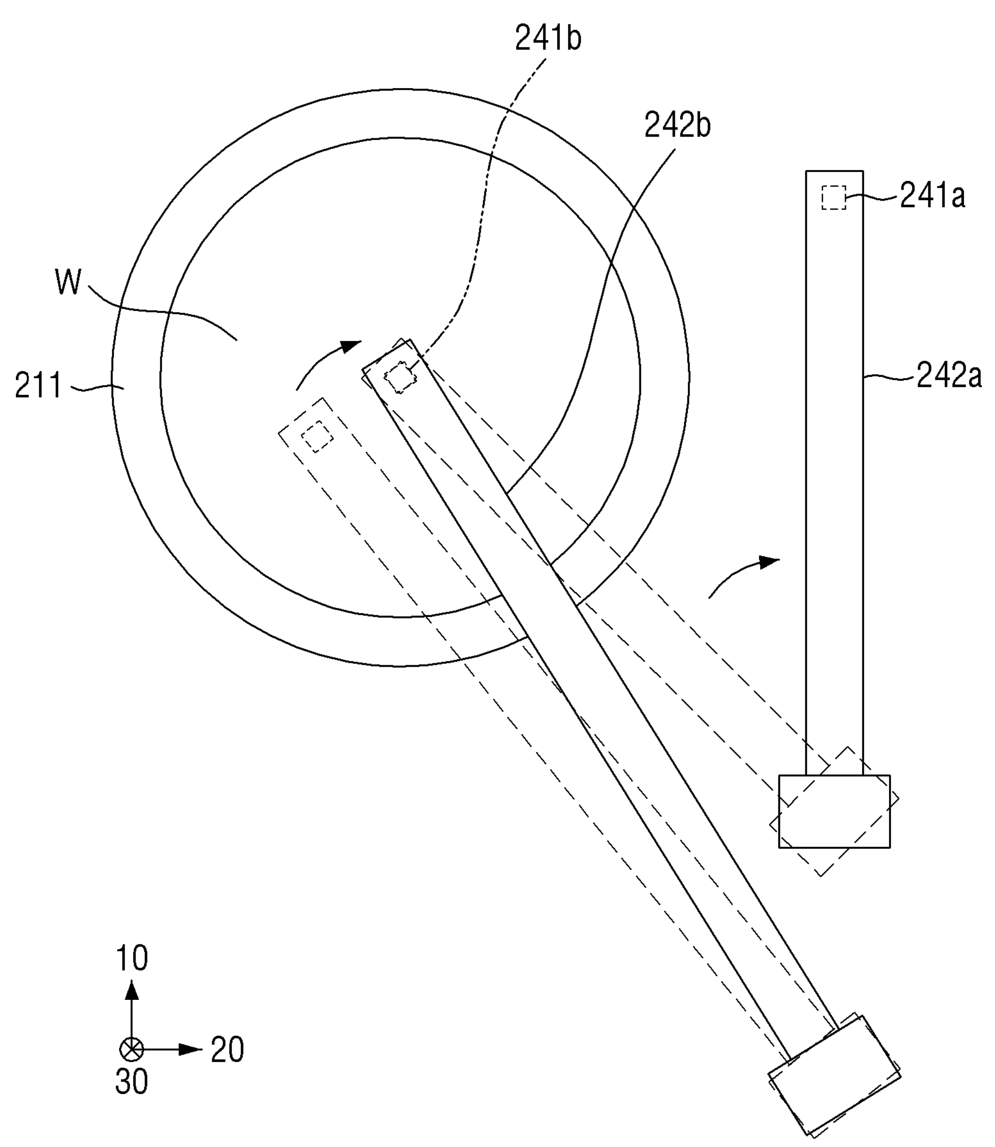

[FIG. 11]
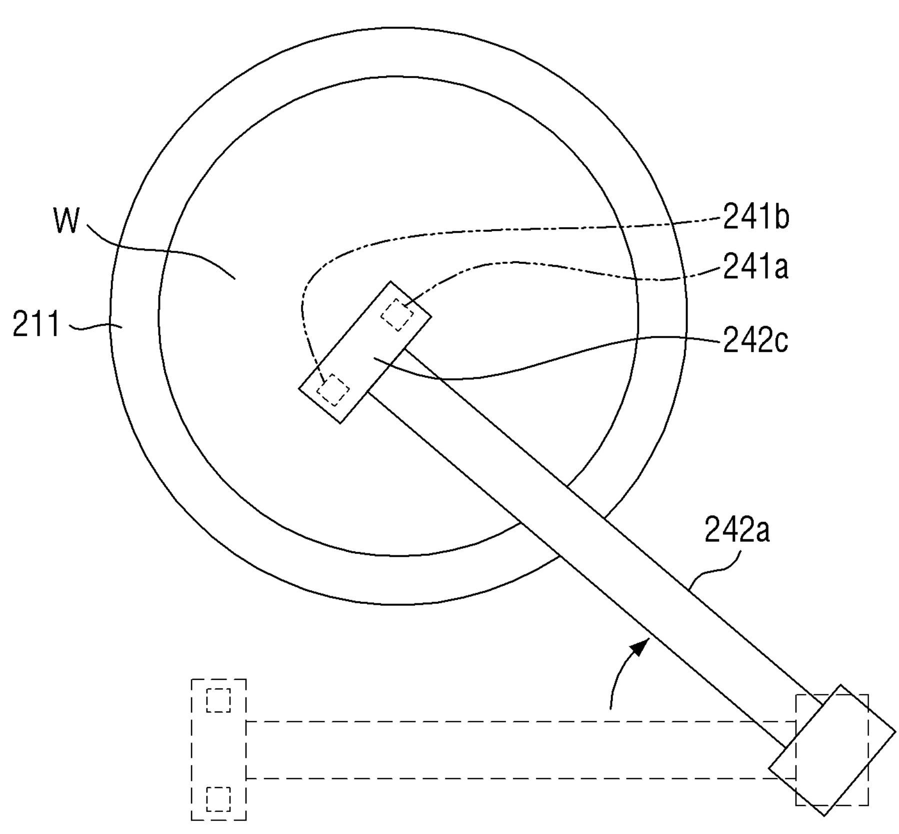
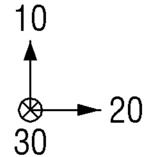

[FIG. 12]
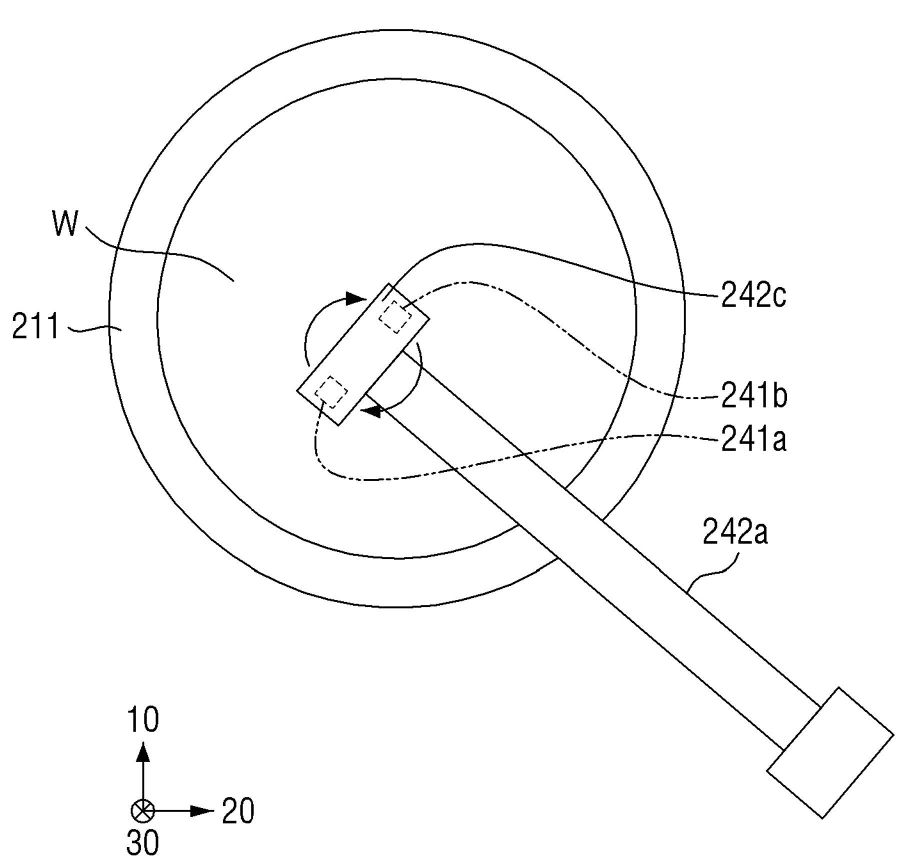

[FIG. 13]
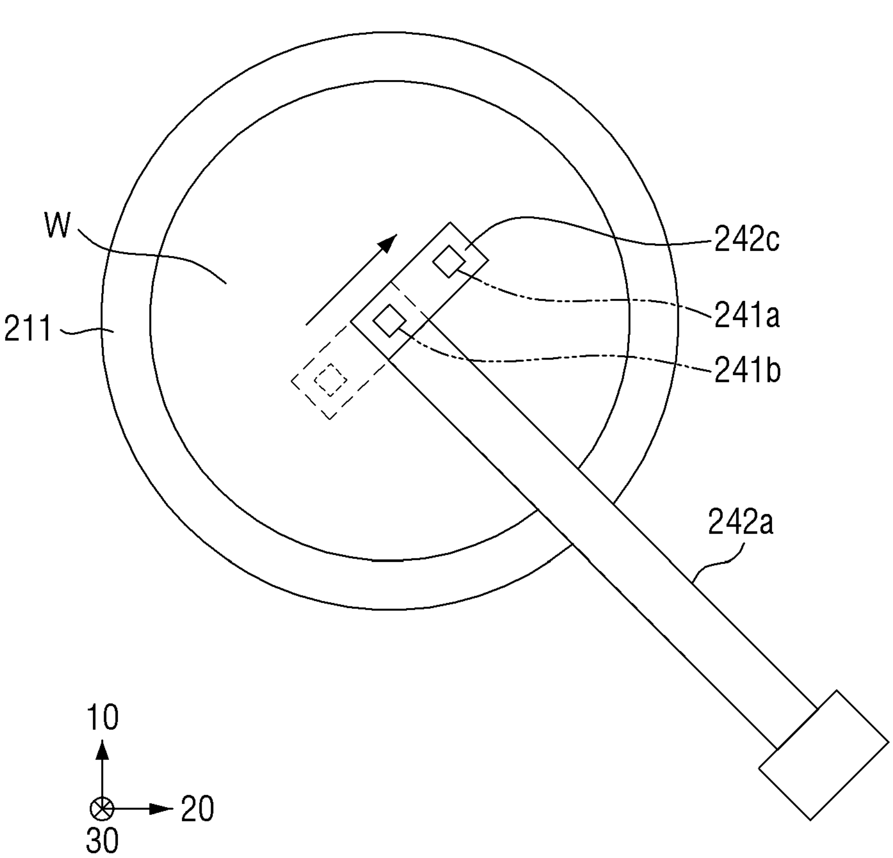

SUBSTRATE TREATMENT APPARATUS AND METHOD

This application claims the benefit of Korean Patent Application No. 10-2021-0059715, filed on May 10, 2021, in the Korean Intellectual Property Office, the disclosure of which is incorporated herein in its entirety by reference.

BACKGROUND

1. Field

The present disclosure relates to a substrate treatment apparatus and method, and more particularly, to a substrate cleaning apparatus and method.

2. Description of the Related Art

A semiconductor device manufacturing process may be continuously performed in a semiconductor device manufacturing facility and may be divided into a pre-process and a post-process. The semiconductor device manufacturing facility may be installed in a space defined as a FAB to manufacture a semiconductor device.

The pre-process refers to a process of forming a circuit pattern on a wafer to complete a chip. The pre-process may include a deposition process for forming a thin film on a wafer, a photolithography process for transferring a photoresist onto the thin film using a photomask, an etching process for selectively removing unnecessary portions using chemical substances or reactive gases to form a desired circuit pattern on the wafer, an ashing process for removing the photoresist remaining after the etching, an ion implantation process for implanting ions into a portion connected to the circuit pattern to obtain characteristics of an electronic device, and a cleaning process for removing contaminants from the wafer.

The post-process refers to a process of evaluating the performance of a product finished through the pre-process. The post-process may include a primary inspection process for distinguishing between good and bad products by inspecting whether each chip on the wafer operates, a package process for cutting and separating each chip into a product shape through dicing, die bonding, wire bonding, molding, marking, etc., and a final inspection process for finally inspecting product characteristics and reliability through electrical characteristic inspection, burn-in inspection, etc.

When a cleaning process is performed on a wafer, the wafer may be cleaned with a first chemical and then may be additionally cleaned with a second chemical. In this case, the first chemical and the second chemical may be provided to the wafer through different nozzles.

However, a waiting time may occur while the nozzles are changed to provide the second chemical following the first chemical. During this waiting time, the surface of the wafer may become dry, causing defects of the wafer such as contamination of the wafer.

SUMMARY

Aspects of the present disclosure provide a substrate treatment apparatus and method for treating a substrate while preventing the surface of the substrate from drying out.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a substrate treatment method including: moving a first nozzle to above a first point on a substrate; ejecting a first substrate treatment liquid onto the substrate from the first nozzle; moving a second nozzle to above the first point; and ejecting a second substrate treatment liquid onto the substrate from the second nozzle, wherein the second nozzle is positioned above a second point on the substrate before moving to above the first point.

The first point may be a center point of the substrate.

The second point may be closer to the first point than to an edge of the substrate.

The second nozzle may move to above the second point when the first nozzle moves to above the first point or may move to above the second point when the first nozzle ejects the first substrate treatment liquid onto the substrate.

The first nozzle may move from above the substrate while the second nozzle moves to above the first point.

The second nozzle may be at a different height from the first nozzle.

While the second nozzle moves to above the first point, the first nozzle may eject the first substrate treatment liquid onto the substrate, or the second nozzle may eject the second substrate treatment liquid onto the substrate or eject deionized water onto the substrate.

The first substrate treatment liquid may include a component not included in the second substrate treatment liquid.

The first substrate treatment liquid may include a hydrofluoric acid component, and the second substrate treatment liquid may include an ammonia water component.

The method may further include: moving an n-th nozzle to above the first point; and ejecting an n-th substrate treatment liquid onto the substrate from the n-th nozzle, wherein n may be a natural number equal to or greater than 3.

The method may further include ejecting deionized water onto the substrate when the ejecting of the second substrate treatment liquid is finished.

According to another aspect of the present disclosure, there is provided a substrate treatment method including: moving a first nozzle to above a first point on a substrate; ejecting a first substrate treatment liquid onto the substrate from the first nozzle; moving a second nozzle to above the first point; and ejecting a second substrate treatment liquid onto the substrate from the second nozzle, wherein the second nozzle is positioned above a second point on the substrate, which is closer to the first point than to an edge of the substrate, before moving to above the first point, and while the second nozzle moves to above the first point, the first nozzle ejects the first substrate treatment liquid onto the substrate, or the second nozzle ejects the second substrate treatment liquid onto the substrate or ejects deionized water onto the substrate.

According to another aspect of the present disclosure, there is provided a substrate treatment apparatus including: a first nozzle ejecting a first substrate treatment liquid onto a substrate when moving to above a first point on the substrate; and a second nozzle ejecting a second substrate treatment liquid onto the substrate when moving to above the first point, wherein the second nozzle is positioned above a second point on the substrate before moving to above the first point.

The first nozzle and the second nozzle may be installed at ends of a first nozzle support and a second nozzle support, respectively.

When the second nozzle moves to above the first point, the first nozzle support and the second nozzle support may simultaneously move.

The first nozzle support and the second nozzle support may move to cross each other.

The first nozzle and the second nozzle may be respectively installed at both ends of a third nozzle support coupled to an end of a first nozzle support.

When the second nozzle moves to above the first point, the third nozzle support may rotate or reciprocate.

The substrate treatment apparatus may be an apparatus for cleaning the substrate.

BRIEF DESCRIPTION OF THE DRAWINGS

These and/or other aspects will become apparent and more readily appreciated from the following description of the embodiments, taken in conjunction with the accompanying drawings in which:

FIG. 1 schematically illustrates the internal configuration of a substrate treatment system according to an embodiment of the present disclosure;

FIG. 2 schematically illustrates the internal structure of a substrate treatment apparatus constituting the substrate treatment system according to the embodiment of the present disclosure;

FIG. 3 is a first exemplary view illustrating various embodiments of a spray module constituting a substrate treatment apparatus according to an embodiment of the present disclosure;

FIG. 4 is a second exemplary view illustrating various embodiments of the spray module constituting the substrate treatment apparatus according to the embodiment of the present disclosure;

FIG. 5 is a flowchart sequentially illustrating a substrate treatment method of a substrate treatment apparatus according to an embodiment of the present disclosure;

FIG. 6 is a first exemplary view related to an exemplary operation of a substrate treatment apparatus for explaining the substrate treatment method of FIG. 5;

FIG. 7 is a second exemplary view related to the exemplary operation of the substrate treatment apparatus for explaining the substrate treatment method of FIG. 5;

FIG. 8 is a third exemplary view related to the exemplary operation of the substrate treatment apparatus for explaining the substrate treatment method of FIG. 5;

FIG. 9 is a fourth exemplary view related to the exemplary operation of the substrate treatment apparatus for explaining the substrate treatment method of FIG. 5;

FIG. 10 is a fifth exemplary view related to the exemplary operation of the substrate treatment apparatus for explaining the substrate treatment method of FIG. 5;

FIG. 11 is a first exemplary view related to another exemplary operation of the substrate treatment apparatus for explaining the substrate treatment method of FIG. 5;

FIG. 12 is a second exemplary view related to the another exemplary operation of the substrate treatment apparatus for explaining the substrate treatment method of FIG. 5; and FIG. 13 is a third exemplary view related to the another exemplary operation of the substrate treatment apparatus for explaining the substrate treatment method of FIG. 5.

DETAILED DESCRIPTION

Hereinafter, exemplary embodiments of the present disclosure will be described in greater detail with reference to the attached drawings. Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims. Like reference numerals refer to like elements throughout the specification.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Spatially relative terms, such as "below," "beneath," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in detail with reference to the attached drawings. In the following description with reference to the attached drawings, like or corresponding elements will be indicated by like reference numerals, and a redundant description thereof will be omitted.

The present disclosure relates to a substrate treatment apparatus and method for treating a substrate (e.g., a wafer) while preventing the surface of the substrate from drying out. Specifically, the present disclosure relates to a substrate treatment apparatus and method for treating a substrate by successively providing a first chemical and a second chemical so that a waiting time does not occur after the substrate is treated with the first chemical until the substrate is treated with the second chemical.

According to the present disclosure, since there is no waiting time, it is possible to prevent the surface of the substrate from drying out, thereby preventing contamination of the substrate and improving productivity (yield).

The present disclosure will hereinafter be described in detail with reference to the drawings and the like.

FIG. 1 schematically illustrates the internal configuration of a substrate treatment system 100 according to an embodiment of the present disclosure.

Referring to FIG. 1, the substrate treatment system 100 may include a substrate treatment apparatus 110, a substrate treatment liquid providing apparatus 120, and a controller 130.

The substrate treatment apparatus 110 treats a substrate using a chemical. The substrate treatment apparatus 110 may be implemented as a cleaning process chamber for cleaning a substrate using a chemical.

The chemical may be a liquid substance (e.g., an organic solvent) or a gaseous substance. The chemical may include substances that are highly volatile and highly persistent due to their nature of generating a lot of fume or high viscosity. The chemical may be selected from, for example, a substance including an isopropyl alcohol (IPA) component, a substance including a sulfuric acid component (e.g., SPM including a sulfuric acid component and a hydrogen peroxide component), a substance including an ammonia water component (e.g., SC-1 ($H_2O_2$+$NH_4OH$), a substance including a hydrofluoric acid component (e.g., diluted hydrogen fluoride (DHF)), a substance including a phosphoric acid component, etc. These chemicals used to treat a substrate will hereinafter be defined as substrate treatment liquids.

When implemented as a cleaning process chamber, the substrate treatment apparatus 110 may include a substrate support module 210, a treatment liquid recovery module 220, a lifting module 230, and a spray module 240 as illustrated in FIG. 2.

FIG. 2 schematically illustrates the internal structure of the substrate treatment apparatus 110 constituting the substrate treatment system according to the embodiment of the present disclosure. The following description will be provided with reference to FIG. 2.

The substrate support module 210 supports a substrate W. When treating the substrate W, the substrate support module 210 may rotate the substrate W in directions (a first direction 10 and a second direction 20) perpendicular to a third direction 30. The substrate support module 210 may be disposed inside the treatment liquid recovery module 220 to recover a substrate treatment liquid used in treating the substrate W.

The substrate support module 210 may include a spin head 211, a rotation shaft 212, a rotation driver 213, a support pin 214, and a guide pin 215.

The spin head 211 rotates along a rotation direction (a direction perpendicular to the third direction 30) of the rotation shaft 212. The spin head 211 may have the same shape as the substrate W. However, the current embodiment is not limited thereto. The spin head 211 may also have a shape different from that of the substrate W.

The rotation shaft 212 generates a rotational force using energy provided from the rotation driver 213. The rotation shaft 212 may be coupled to each of the rotation driver 213 and the spin head 211 to transmit the rotational force generated by the rotation driver 213 to the spin head 211. The spin head 211 rotates along the rotation shaft 212, in which case the substrate W seated on the spin head 211 may also rotate together with the spin head 211.

The support pin 214 and the guide pin 215 fix the substrate W on the spin head 211. To this end, the support pin 214 supports a bottom surface of the substrate W on the spin head 211, and the guide pin 215 supports a side surface of the substrate W. The support pin 214 and the guide pin 215 may each be installed in plural numbers on the spin head 211.

The support pin 214 as a whole may have an annular ring shape. Therefore, the support pin 214 may support the bottom surface of the substrate W so that the substrate W is spaced apart from a top surface of the spin head 211 by a predetermined distance.

The guide pin 215 is a chucking pin and may support the substrate W so that the substrate W does not deviate from its original position when the spin head 211 rotates.

Meanwhile, a back nozzle (not illustrated) may also be installed on the spin head 211. The back nozzle is designed to clean the bottom surface of the substrate W. The back nozzle may be installed in a center of the top surface of the spin head 211 and may spray a substrate treatment liquid to the bottom surface of the substrate W.

The treatment liquid recovery module 220 recovers a substrate treatment liquid used to treat the substrate W. The treatment liquid recovery module 220 may be installed to surround the substrate support module 210 and thus may provide a space in which a treatment process is performed on the substrate W.

After the substrate W is seated and fixed on the substrate support module 210, when the substrate W starts to be rotated by the substrate support module 210, the spray module 240 may spray a substrate treatment liquid onto the substrate W under the control of a controller 130. Then, the substrate treatment liquid ejected onto the substrate W may be dispersed in a direction in which the treatment liquid recovery module 220 is located due to a centrifugal force generated by the rotational force of the substrate support module 210. In this case, the treatment liquid recovery module 220 may recover the substrate treatment liquid flowing into the treatment liquid recovery module 220 through inlets (i.e., a first opening 224 of a first recovery container 221, a second opening 225 of a second recovery container 222, and a third opening 226 of a third recovery container 223 to be described later).

The treatment liquid recovery module 220 may include a plurality of recovery containers. The treatment liquid recovery module 220 may include, for example, three recovery containers. When the treatment liquid recovery module 220 includes a plurality of recovery containers as described above, a substrate treatment liquid used in a substrate treatment process may be separated and recovered using the recovery containers. Accordingly, the substrate treatment liquid can be recycled.

When the treatment liquid recovery module 220 includes three recovery containers, it may include the first recovery container 221, the second recovery container 222, and the third recovery container 223. The first recovery container 221, the second recovery container 222, and the third recovery container 223 may be implemented as, for example, bowls.

The first recovery container 221, the second recovery container 222, and the third recovery container 223 may recover different substrate treatment liquids. For example, the first recovery container 221 may recover water, the second recovery container 222 may recover a first chemical (e.g., any one of a substance including an IPA component and a substance including an SPM component), and the third recovery container 223 may recover a second chemical (e.g., the other one of the substance including the IPA component and the substance including the SPM component).

The first recovery container 221, the second recovery container 222, and the third recovery container 223 may be connected to recovery lines 227, 228, and 229 extending downward (in the third direction 30) from their bottom surfaces. A first treatment liquid, a second treatment liquid, and a third treatment liquid recovered through the first recovery container 221, the second recovery container 222, and the third recovery container 223 may be treated to be reusable by a treatment liquid recycling system (not illustrated).

The first recovery container 221, the second recovery container 222, and the third recovery container 223 may be provided in an annular ring shape surrounding the substrate support module 210. The first recovery container 221, the second recovery container 222, and the third recovery container 223 may be larger from the first recovery container 221 toward the third recovery container 223 (that is, in the second direction 20). A gap between the first recovery container 221 and the second recovery container 222 may be defined as a first gap, and a gap between the second recovery container 222 and the third recovery container 223 may be defined as a second gap. In this case, the first gap may be the same as the second gap. However, the current embodiment is not limited thereto. The first gap and the second gap may also be different. That is, the first gap may be greater than the second gap or may be smaller than the second gap.

The lifting module 230 rectilinearly moves the treatment liquid recovery module 220 in a vertical direction (the third direction 30). The lifting module 230 may serve to adjust the relative height of the treatment liquid recovery module 220 with respect to the substrate support module 210 (or the substrate W).

The lifting module 230 may include a bracket 231, a first support shaft 232, and a first driver 233.

The bracket 231 is fixed to an outer wall of the treatment liquid recovery module 220. The bracket 231 may be coupled to the first support shaft 232 that is moved in the vertical direction by the first driver 233.

When the substrate W is to be seated on the substrate support module 210, the substrate support module 210 may be positioned above the treatment liquid recovery module 220. Likewise, when the substrate W is to be detached from the substrate support module 210, the substrate support module 210 may also be positioned above the treatment liquid recovery module 220. In this case, the lifting module 230 may serve to lower the treatment liquid recovery module 220.

When a treatment process is performed on the substrate W, a substrate treatment liquid ejected onto the substrate W may be recovered to any one of the first recovery container 221, the second recovery container 222, and the third recovery container 223 according to the type of the substrate treatment liquid. In this case, the lifting module 230 may serve to lift the treatment liquid recovery module 220 to a corresponding position. For example, when the first treatment liquid is used as a substrate treatment liquid, the lifting module 230 may lift the treatment liquid recovery module 220 so that the substrate W is positioned at a height corresponding to the first opening 224 of the first recovery container 221.

In the current embodiment, the lifting module 230 may also adjust the relative height of the treatment liquid recovery module 220 with respect to the substrate support module 210 (or the substrate W) by rectilinearly moving the substrate support module 210 in the vertical direction.

However, the current embodiment is not limited thereto. The lifting module 230 may also adjust the relative height of the treatment liquid recovery module 220 with respect to the substrate support module 210 (or the substrate W) by rectilinearly moving both the substrate support module 210 and the treatment liquid recovery module 220 in the vertical direction.

The spray module 240 supplies a substrate treatment liquid onto the substrate W when the substrate W is treated. At least one spray module 240 may be installed in a substrate treatment apparatus 110. When a plurality of spray modules 240 are installed in the substrate treatment apparatus 110, they may spray different substrate treatment liquids onto the substrate W.

The spray module 240 may include a nozzle 241, a nozzle support 242, a second support shaft 243, and a second driver 244.

The nozzle 241 is installed at an end of the nozzle support 242. The nozzle 241 may be moved to a process position or a standby position by the second driver 244.

In the above description, the process position refers to a region above the substrate W, and the standby position refers to a region except for the process position. The nozzle 241 may be moved to the process position when a substrate treatment liquid is ejected onto the substrate W and may be moved from the process position to the standby position after the substrate treatment liquid is ejected onto the substrate W.

The nozzle support 242 supports the nozzle 241. The nozzle support 242 may extend in a direction corresponding to a longitudinal direction of the spin head 211. That is, the longitudinal direction of the nozzle support 242 may be provided along the second direction 20.

The nozzle support 242 may be coupled to the second support shaft 243 extending in a direction perpendicular to the longitudinal direction of the nozzle support 242. The second support shaft 243 may extend in a direction corresponding to a height direction of the spin head 211. That is, the longitudinal direction of the second support shaft 243 may be provided along the third direction 30.

The second driver 244 rotates and lifts the second support shaft 243 and the nozzle support 242 interlocked with the second support shaft 243. According to this function of the second driver 244, the nozzle 241 may be moved to the process position or the standby position.

The following description will be provided with reference to FIG. 1 again.

The substrate treatment liquid providing apparatus 120 provides a substrate treatment liquid to the substrate treatment apparatus 110. To this end, the substrate treatment liquid providing apparatus 120 may be connected to the spray module 240 of the substrate treatment apparatus 110 and may operate under the control of the controller 130.

The controller 130 controls the operation of the substrate treatment apparatus 110. Specifically, the controller 130 may control the operation of the rotation driver 213 of the substrate support module 210, the first driver 233 of the lifting module 230, and the second driver 244 of the spray module 240.

The controller 130 may be implemented as a computer or server including a processor (e.g., a microprocessor) having an arithmetic function and a control function, a memory having a storage function, a power supply having a power supply function, etc. In the current embodiment, the controller 130 may also be a processor.

The controller 130 may also control the operation of the substrate treatment liquid providing apparatus 120 so that a substrate treatment liquid can be supplied from the substrate treatment liquid providing apparatus 120 to the substrate treatment apparatus 110 when necessary.

The substrate treatment apparatus 110 may treat the substrate W by sequentially providing different types of substrate treatment liquids onto the substrate W. For example, in order to provide two substrate treatment liquids of different types onto the substrate W, the spray module 240 may include a first nozzle support 242*a*, a second nozzle support 242*b*, a first nozzle 241*a*, and a second nozzle 241*b* as illustrated in FIG. 3.

In the above case, the first nozzle 241*a* may be installed at an end of the first nozzle support 242*a*, and the second nozzle 241*b* may be installed at an end of the second nozzle support 242*b*. FIG. 3 is a first exemplary view illustrating various embodiments of the spray module 240 constituting a substrate treatment apparatus according to an embodiment of the present disclosure.

However, the current embodiment is not limited thereto. In order to provide two substrate treatment liquids of different types onto the substrate W, the spray module 240 may also include a first nozzle support 242*a*, a third nozzle support 242*c*, a first nozzle 241*a*, and a second nozzle 241*b* as illustrated in FIG. 4.

In the above case, the rotatable third nozzle support 242*c* may be coupled to an end of the first nozzle support 242*a*, and the first nozzle 241*a* and the second nozzle 241*b* may be installed at both ends of the third nozzle support 242*c*, respectively. FIG. 4 is a second exemplary view illustrating various embodiments of the spray module 240 constituting the substrate treatment apparatus according to the embodiment of the present disclosure.

When three or more substrate treatment liquids of different types are provided onto the substrate W to treat the substrate W, one nozzle 241 may be installed on each nozzle support 242 as shown in the example of FIG. 3, or a plurality of nozzles 241 may be installed on one nozzle support 242 as shown in the example of FIG. 4.

However, the current embodiment is not limited thereto. In a combination of the example of FIG. 3 and the example of FIG. 4, one nozzle 241 may be installed on some nozzle supports 242, and a plurality of nozzles 241 may be installed on some other nozzle supports 242.

In the above description, different types of substrate treatment liquids mean that the substrate treatment liquids are different in at least one of the components included therein. For example, when a first substrate treatment liquid and a second substrate treatment liquid include a plurality of components, the first substrate treatment liquid may include a hydrofluoric acid component not included in the second substrate treatment liquid, and the second substrate treatment liquid may include an ammonia water component not included in the first substrate treatment liquid.

Next, a method of treating a substrate by successively using different types of substrate treatment liquids will be described.

FIG. 5 is a flowchart sequentially illustrating a substrate treatment method of a substrate treatment apparatus according to an embodiment of the present disclosure. The following description will be provided with reference to FIG. 5.

When a substrate W is seated on a spin head 211 and supported by a support pin 214 and a guide pin 215, a substrate treatment apparatus 110 performs a cleaning process on the substrate W.

First, a first substrate treatment liquid is provided onto the substrate W using a first nozzle 241*a* (operation S310), and then a second substrate treatment liquid is provided onto the substrate W using a second nozzle 241*b* (operation S320).

When the second nozzle 241*b* moves to above the substrate W to provide the second substrate treatment liquid onto the substrate W following the first substrate treatment liquid, a waiting time may occur. That is, when a nozzle for providing a corresponding substrate treatment liquid is changed for each substrate treatment process, a waiting time may occur due to the nozzle change in terms of hardware.

However, if the surface of the substrate W is dried during such a waiting time, the substrate W may be contaminated, thus reducing productivity and yield. In the current embodiment, the first substrate treatment liquid and the second substrate treatment liquid are successively provided so that a waiting time does not occur. This can prevent contamination of the substrate W and improve productivity and yield.

To this end, in the current embodiment, the substrate treatment apparatus 110 may operate according to the following sequence. First, a case where a spray module 240 includes a first nozzle support 242*a*, a second nozzle support 242*b*, a first nozzle 241*a*, and a second nozzle 241*b* will be described as an example.

First, in order to provide the first substrate treatment liquid onto the substrate W, the first nozzle support 242*a* moves to above a central region of the substrate W as illustrated in FIG. 6. At this time, the second nozzle support 242*b* moves to above an outer region of the substrate W. FIG. 6 is a first exemplary view related to an exemplary operation of a substrate treatment apparatus for explaining the substrate treatment method of FIG. 5.

When the first nozzle support 242*a* is positioned above the central region of the substrate W, the first nozzle 241*a* installed at an end of the first nozzle support 242*a* provides the first substrate treatment liquid onto the substrate W (spray ejection).

Meanwhile, the second nozzle support 242*b* does not move together with the first nozzle support 242*a* and may move to above the outer region of the substrate W while the first nozzle 241*a* is providing the first substrate treatment liquid onto the substrate W.

As described above, when the first nozzle support 242*a* moves to above the central region of the substrate W or while the first nozzle 241*a* is providing the first substrate treatment liquid onto the substrate W, the second nozzle support 242*b* may move to above the outer region of the substrate W.

In this case, a position L to which the second nozzle support 242*b* moves may be closer to a center point C of the substrate W than to an edge point S of the substrate W. That is, as illustrated in FIG. 7, a distance $d_1$ between the L point and the C point may be smaller than a distance $d_2$ between the L point and the S point ($d_1<d_2$). For example, when the radius of the substrate W is 150 P, the position to which the second nozzle support 242*b* moves may be 130 P from the edge point of the substrate W.

However, the current embodiment is not limited thereto. The distance $d_1$ between the L point and the C point may also be equal to the distance $d_2$ between the L point and the S point ($d_1=d_2$) or may be greater than the distance $d_2$ between the L point and the S point ($d_1>d_2$). FIG. 7 is a second exemplary view related to the exemplary operation of the substrate treatment apparatus for explaining the substrate treatment method of FIG. 5.

Next, in order to provide the second substrate treatment liquid onto the substrate W, the second nozzle support 242*b* moves to above the central region of the substrate W. At this time, in order to minimize the occurrence of a waiting time, the first nozzle support 242*a* moves to its original position (i.e., home), and at the same time, the second nozzle support 242*b* moves to above the central region of the substrate W. FIG. 8 is a third exemplary view related to the exemplary operation of the substrate treatment apparatus for explaining the substrate treatment method of FIG. 5.

When the second nozzle support 242*b* is positioned above the central region of the substrate W, the second nozzle 241*b* installed at an end of the second nozzle support 242*b* provides the second substrate treatment liquid onto the substrate W (spray ejection).

Even if the first nozzle support 242*a* and the second nozzle support 242*b* move at the same time as illustrated in FIG. 8, a waiting time may occur after the first substrate treatment liquid is provided until the second substrate treatment liquid is provided. Therefore, in this case, in the current embodiment, when the provision of the first substrate treatment liquid is stopped, the second nozzle support 242*b* may provide the second substrate treatment liquid onto the substrate W through the second nozzle 241*b* while moving to above the central region of the substrate W (leakage ejection). That is, the second nozzle 241*b* may perform leakage ejection while moving from above the outer region of the substrate W to above the central region of the substrate W and may perform spray ejection after moving to above the central region of the substrate W.

In the above case, in the current embodiment, it is also possible for the first nozzle 241*a* to provide the first substrate treatment liquid onto the substrate W until the second nozzle support 242*b* is positioned above the central region of the substrate W (leakage ejection). That is, the first nozzle 241*a* may perform spray ejection while positioned above the central region of the substrate W and may perform leakage ejection while moving from above the central region of the substrate W to the outside until the second nozzle support 242*b* is positioned above the central region of the substrate W.

In the above case, in the current embodiment, it is also possible to provide water onto the substrate W until the second nozzle support 242*b* is positioned above the central region of the substrate W.

If water is provided onto the substrate W after the provision of the first substrate treatment liquid until the second substrate treatment liquid is provided, the substrate W may be wetted and thus prevented from drying out.

However, since the substrate W can be contaminated depending on the cleanliness of water, deionized water (DIW) may be provided onto the substrate W in the current embodiment in consideration of this aspect.

When the first nozzle support 242*a* moves to its original position (i.e., home) and the second nozzle support 242*b* moves to above the central region of the substrate W, the first nozzle support 242*a* and the second nozzle support 242*b* may collide with each other. To prevent this, the first nozzle support 242*a* and the second nozzle support 242*b* may have different heights. That is, as illustrated in FIG. 9, the second nozzle support 242*b* may be formed at a height higher than that of the first nozzle support 242*a* from the spin head 211. Alternatively, the second nozzle support 242*b* may be formed at a height lower than that of the first nozzle support 242*a* from the spin head 211. FIG. 9 is a fourth exemplary view related to the exemplary operation of the substrate treatment apparatus for explaining the substrate treatment method of FIG. 5.

The example of FIG. 8 is an example of a case where the first nozzle support 242*a* rotates in a direction (i.e., a counterclockwise direction) different from that of the second nozzle support 242*b* in order to return to its original position. However, the current embodiment is not limited thereto. The first nozzle support 242*a* may also rotate in the same direction (i.e., a clockwise direction) as the second nozzle support 242*b*. In this case, the first nozzle support 242*a* may move to the outside as illustrated in FIG. 10.

The first nozzle support 242*a* moved to the outside may return when the second nozzle support 242*b* returns to its original position after the treatment of the substrate W is completed. FIG. 10 is a fifth exemplary view related to the exemplary operation of the substrate treatment apparatus for explaining the substrate treatment method of FIG. 5.

Next, a case where the spray module 240 includes a first nozzle support 242*a*, a third nozzle support 242*c*, a first nozzle 241*a*, and a second nozzle 241*b* will be described as an example.

First, in order to provide the first substrate treatment liquid onto the substrate W, the first nozzle support 242*a* moves to position the first nozzle 241*a* above the central region of the substrate W as illustrated in FIG. 11. FIG. 11 is a first exemplary view related to another exemplary operation of the substrate treatment apparatus for explaining the substrate treatment method of FIG. 5.

When the first nozzle 241*a* is positioned above the central region of the substrate W, the first substrate treatment liquid is provided onto the substrate W (spray ejection).

Then, in order to provide the second substrate treatment liquid onto the substrate W, the third nozzle support 242*c* is rotated to position the second nozzle 241*b* above the central region of the substrate W as illustrated in FIG. 12. FIG. 12 is a second exemplary view related to the another exemplary operation of the substrate treatment apparatus for explaining the substrate treatment method of FIG. 5.

When the second nozzle 241*b* is positioned above the central region of the substrate W, the second substrate treatment liquid is provided onto the substrate W (spray ejection).

In order to provide the second substrate treatment liquid onto the substrate W, it is also possible for the third nozzle support 242*c* to reciprocate to position the second nozzle 241*b* above the central region of the substrate W as illustrated in FIG. 13. FIG. 13 is a third exemplary view related to the another exemplary operation of the substrate treatment apparatus for explaining the substrate treatment method of FIG. 5.

Due to the rotation of the third nozzle support 242*c*, a waiting time may occur after the first substrate treatment liquid is provided until the second substrate treatment liquid is provided. In this case, in the current embodiment, when the provision of the first substrate treatment liquid is stopped, the second nozzle 241*b* may provide the second substrate treatment liquid onto the substrate W while moving to above the central region of the substrate W according to the rotation of the third nozzle support 242*c* (leakage ejection). That is, the second nozzle 241*b* may perform leakage ejection while moving from above the outer region of the substrate W to above the central region of the substrate W and may perform spray ejection after moving to above the central region of the substrate W.

In the above case, it is also possible for the first nozzle 241*a* to provide the first substrate treatment liquid onto the substrate W until the second nozzle 241*b* is positioned above the central region of the substrate W (leakage ejection). That is, the first nozzle 241*a* may perform spray ejection while positioned above the central region of the substrate W and may perform leakage ejection while moving from above the central region of the substrate W to the outside until the second nozzle support 242*b* is positioned above the central region of the substrate W.

In the above case, it is also possible to provide water (e.g., deionized water) onto the substrate W until the second nozzle 241*b* is positioned above the central region of the substrate W.

The following description will be provided with reference to FIG. 5 again.

The substrate treatment apparatus 110 may successively provide the first substrate treatment liquid and the second substrate treatment liquid onto the substrate W using the first nozzle 241*a* and the second nozzle 241*b* (operations S310 and S320).

As described above, the first substrate treatment liquid and the second substrate treatment liquid may be different types of chemicals. For example, the first substrate treatment liquid may be DHF, and the second substrate treatment liquid may be SC-1($H_2O_2$+$NH_4OH$).

After treating the substrate W by sequentially using the first substrate treatment liquid and the second substrate treatment liquid, the substrate treatment apparatus 110 rinses the substrate W by providing water (e.g., deionized water) onto the substrate W (operation S330).

In order to provide water onto the substrate W seated on the spin head 211, the substrate treatment apparatus 110 may further include a separate nozzle (not illustrated) for supplying water. The nozzle for supplying water may be installed at an end of the second nozzle 242*b* together with the second nozzle 241*b* or may be installed at an end of another additional nozzle support other than the first nozzle support 242*a* and the second nozzle support 242*b*.

When the nozzle for supplying water is installed at an end of the second nozzle support 242*b* together with the second nozzle 241*b*, the second nozzle support 242*b* may move to above the central region of the substrate W and then successively perform leakage ejection, spray ejection, and DIW ejection.

In the current embodiment, after treating the substrate W by sequentially providing the first substrate treatment liquid and the second substrate treatment liquid (operations S310 and S320) and before treating the substrate W by providing water (operation S330), treating the substrate W by providing a third substrate treatment liquid of a different type from the first substrate treatment liquid and the second substrate treatment liquid may be performed. In the current embodiment, the method described with reference to FIGS. 6 through 13 may be equally applied so that a waiting time does not occur after the provision of the second substrate treatment liquid until the third substrate treatment liquid is provided.

Until now, the substrate treatment apparatus 110, the substrate treatment method of the substrate treatment apparatus 110, and the substrate treatment system 100 including the substrate treatment apparatus 110 according to various embodiments of the present disclosure have been described with reference to FIGS. 1 through 13.

The present disclosure aims to improve productivity (yield) by changing a substrate treatment method. After a first substrate treatment chemical is used, the surface of a substrate W may be wetted with deionized water and kept waiting until a second chemical nozzle moves to the center of the substrate W. In the present disclosure, however, this period is skipped to reduce the risk of contamination due to chemical crossover, and the substrate treatment time is shortened to reduce the overall production time. In the present disclosure, the second chemical nozzle stands by in advance during the first chemical treatment, thereby deleting the deionized water wetting period and even reducing defects from a drying point of view. The present disclosure is applicable to all chemical crossover processes of a substrate treatment apparatus.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A substrate treatment method comprising:

moving a first nozzle to above a first point on a substrate, wherein the first nozzle and a second nozzle move respectively along first and second arcs, wherein the first arc has a different center than the second arc, wherein the first arc has a different radius length than the second arc, and wherein the first nozzle is configured to eject a first substrate treatment liquid and the second nozzle is configured to eject a second substrate treatment liquid;

once the first nozzle is directly above the first point, performing a spray ejection of the first substrate treatment liquid onto the substrate using the first nozzle, wherein the second nozzle is positioned directly above a second point on the substrate while the first nozzle is directly above the first point and performing said spray ejection, wherein the substate has an outermost periphery in a plan view while said spray ejection is performed, and wherein the second point is closer to the first point than to said outermost periphery;

after spray ejecting the first substrate treatment liquid from the first nozzle while the first nozzle is positioned directly above the first point, rotating the first nozzle in a first direction away from a central region of the substrate such that the first nozzle is no longer directly above the first point;

after spray ejecting the first substrate treatment liquid from the first nozzle while the first nozzle is positioned directly above the first point, rotating the second nozzle in a second direction to directly above the first point, wherein the second direction is opposite to the first direction in a plan view;

once the second nozzle is directly above the first point, performing a spray ejection of the second substrate treatment liquid onto the substrate while some amount of the first substrate treatment liquid is still on the substrate; and wherein the method also comprises ejecting the first substrate treatment liquid from the first nozzle onto the substrate while performing the step of moving the first nozzle in the first direction or ejecting the second substrate treatment liquid from the second nozzle onto the substate while performing the step of moving the second nozzle in the second direction.

2. The method of claim 1, wherein the first nozzle and the second nozzle move at different heights from each other.

3. The method of claim 1, further comprising:

performing, by the second nozzle, leakage ejection of the second substrate treatment liquid onto the substrate while performing the step of moving the second nozzle in the second direction.

4. The method of claim 1, further comprising:

ejecting, after the second substrate treatment liquid has been ejected onto the substrate, deionized water onto the substrate from a third nozzle different from the first nozzle and the second nozzle, wherein the deionized water is ejected to rinse the substrate.

5. The method of claim 1, wherein:

the first substrate treatment liquid comprises hydrofluoric acid and the second substrate treatment liquid comprises ammonia water.

* * * * *